United States Patent
Kwon et al.

(10) Patent No.: US 7,595,213 B2
(45) Date of Patent: Sep. 29, 2009

(54) SEMICONDUCTOR DEVICES, CMOS IMAGE SENSORS, AND METHODS OF MANUFACTURING SAME

(75) Inventors: Doo-Won Kwon, Seongnam-si (KR); Jong-Ryeol Yoo, Osan-si (KR); Chang-Rok Moon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 335 days.

(21) Appl. No.: 11/517,238

(22) Filed: Sep. 7, 2006

(65) Prior Publication Data

US 2007/0141801 A1    Jun. 21, 2007

(30) Foreign Application Priority Data

Dec. 15, 2005    (KR) .................. 10-2005-0124112

(51) Int. Cl.
  *H01L 21/00* (2006.01)
(52) U.S. Cl. .......................... 438/60; 438/400
(58) Field of Classification Search ............ 438/60, 438/400
See application file for complete search history.

(56) References Cited

U.S. PATENT DOCUMENTS

| 4,861,729 | A | * | 8/1989 | Fuse et al. ................. 438/246 |
| 2004/0251398 | A1 | | 12/2004 | Mouli et al. ............ 250/214.1 |
| 2005/0045926 | A1 | | 3/2005 | Mouli |
| 2005/0176167 | A1 | * | 8/2005 | Lee ............................. 438/60 |
| 2006/0038252 | A1 | * | 2/2006 | Mouli ....................... 257/446 |
| 2007/0210305 | A1 | * | 9/2007 | Kim et al. ..................... 257/43 |

FOREIGN PATENT DOCUMENTS

| JP | 10-233497 | 9/1998 |
| KR | 1020030001795 | 1/2003 |
| KR | 1020030054020 | 7/2003 |
| KR | 1020040059943 | 7/2004 |
| KR | 1020050062143 | 6/2005 |

* cited by examiner

*Primary Examiner*—Bradley K Smith
(74) *Attorney, Agent, or Firm*—F. Chau & Assoc., LLC

(57) ABSTRACT

A semiconductor device includes: a trench device isolating region formed in a substrate to define a photodiode active region; a channel stop impurity region formed in the substrate contacting the device isolating region, wherein the channel stop impurity region surrounds a bottom and a sidewall of the device isolating region; and a photodiode formed within the photodiode active region.

7 Claims, 8 Drawing Sheets

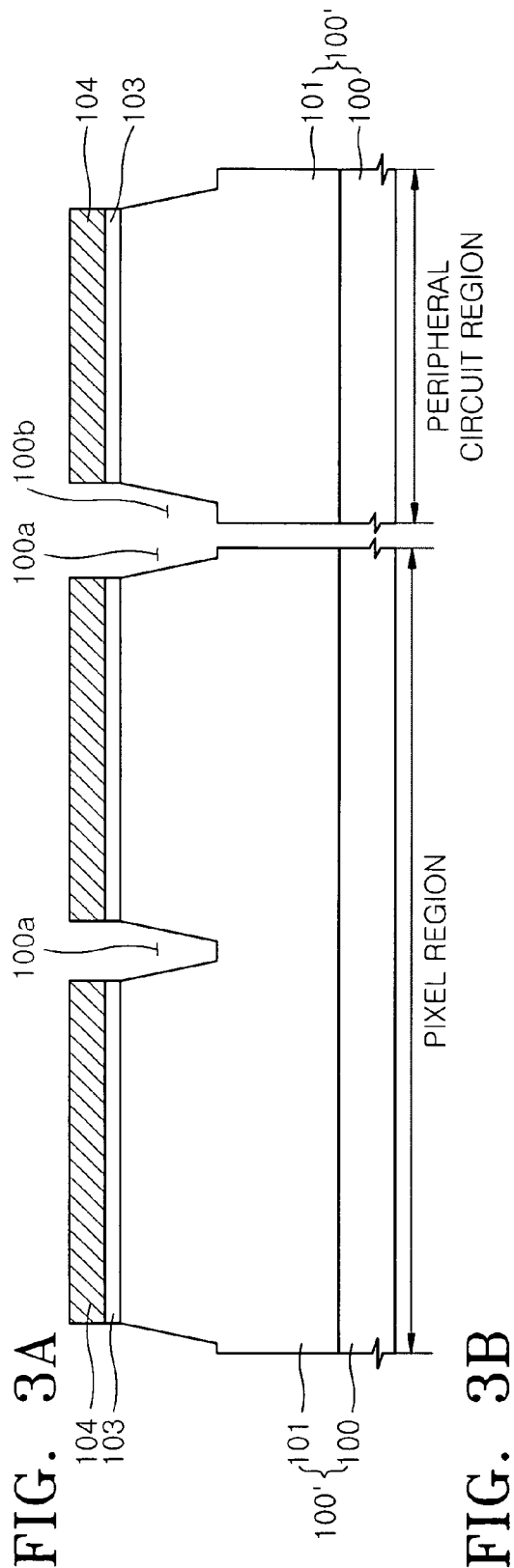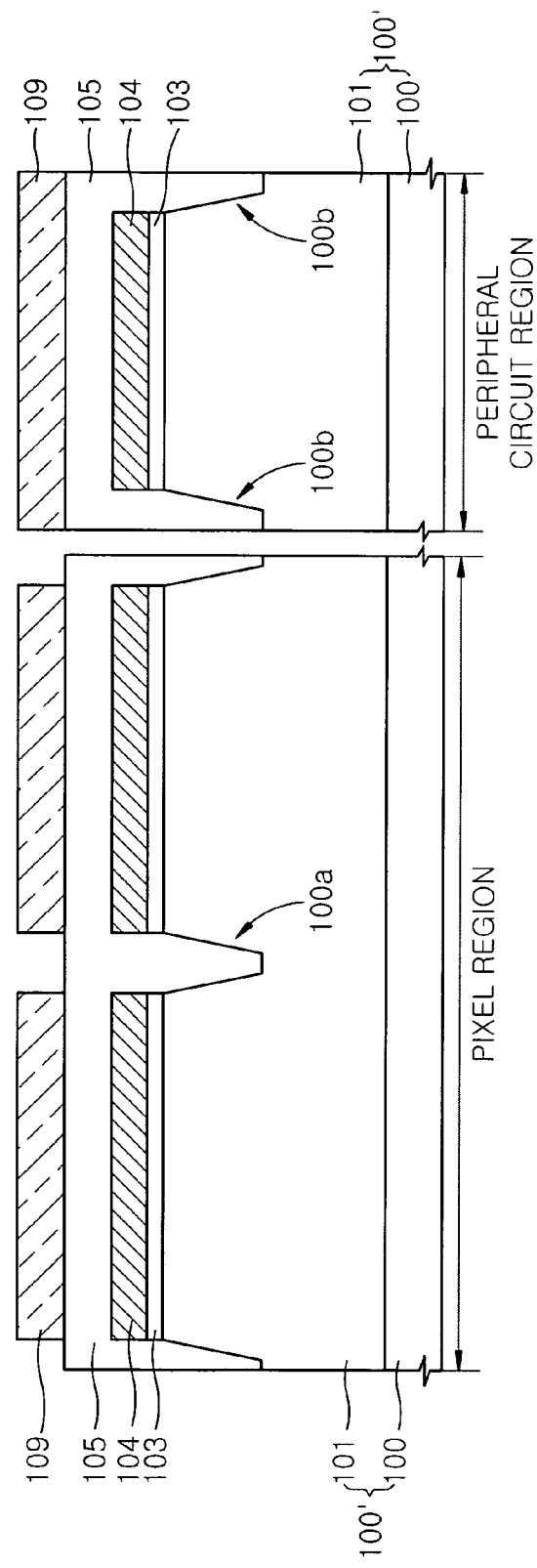

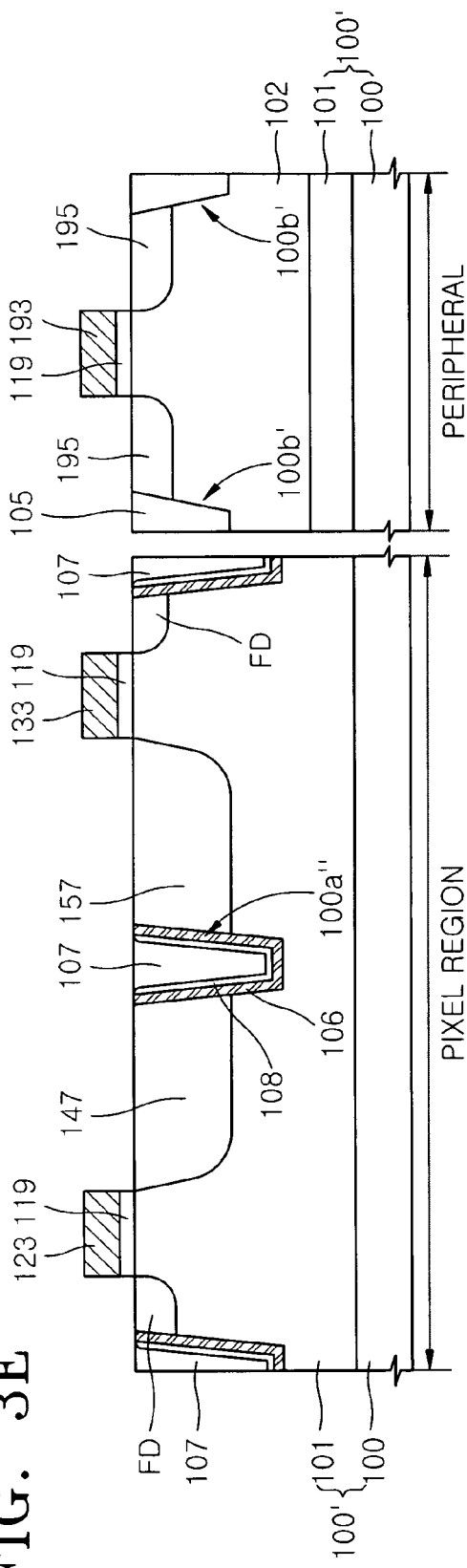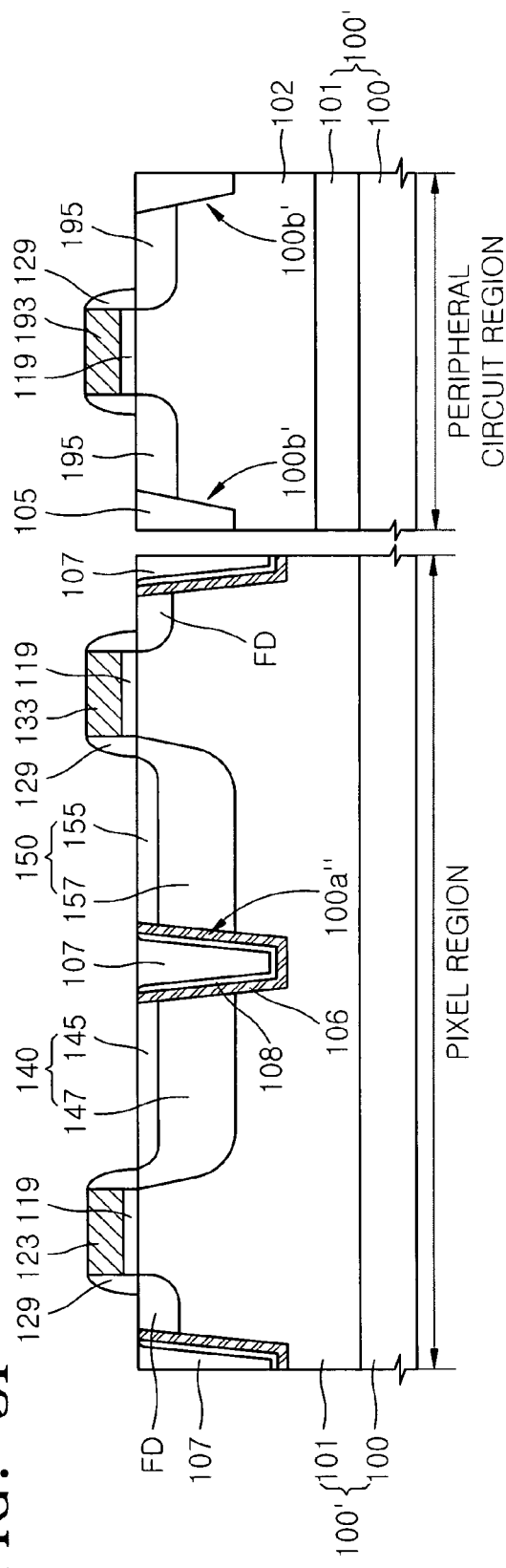

SEMICONDUCTOR DEVICES, CMOS IMAGE SENSORS, AND METHODS OF MANUFACTURING SAME

CROSS-REFERENCE TO RELATED PATENT APPLICATION

This application claims priority to Korean Patent Application No. 10-2005-0124112, filed on Dec. 15, 2005, the disclosure of which is herein incorporated by reference in its entirety.

BACKGROUND OF THE INVENTION

1. Technical Field

The present disclosure relates to semiconductor devices, image sensors, and methods of manufacturing the same and, more particularly, to semiconductor devices having a trench, CMOS image sensors having a trench, and methods of manufacturing semiconductor devices and the CMOS image sensors.

2. Discussion of the Related Art

Image sensors are semiconductor devices that convert optical images into electrical signals. Image sensors can be classified into Charge Coupled Device (CCD) image sensors and CMOS Image Sensors. A CMOS image sensor includes a photodiode that receives optical signals and a MOS transistor that controls the optical signals within a unit pixel. The CCD image sensor has a complicated driving system and a complicated manufacturing process. Signal processing circuits are difficult to fabricate in one CCD chip. In contrast, the CMOS image sensor can be manufactured by standard CMOS techniques, and can be integrated into a single circuit together with other signal processing circuits.

CMOS image sensor fabrication includes forming a device isolating layer on a silicon substrate to define the photodiode active regions and MOS transistor active regions. A CMOS image sensor may exhibit crystalline defects such as dangling bond at an interfacial surface between the device isolating layer and the substrate of the photodiode active region. For example, when the device isolating layer has a Shallow Trench Isolation (STI) structure, such as a trench formed by etching the substrate and filled with an insulating layer, crystalline defects may occur when etching the substrate. The crystalline defects, which act as traps capturing electrons, may become defect or noise components of each pixel, increasing the dark current, i.e., the current that continues to flow in the photodiode when there is no incident light. Thus the crystalline defects of the device isolation region can degrade the imaging characteristics of the CMOS image sensor.

Forming an impurity region within a lower portion of the trench using ion implantation is difficult. Because the ion beam used for ion implantation has forward directivity, the impurity region is mostly formed under the trench without surrounding the sides of the trench. The ion beam or substrate may be tilted during the implantation process so that the impurity region is formed on the sides of the trench, but with no impurity region formed under the trench. A crystalline defect occurring in the interfacial surface of a trench that is not surrounded by an impurity region may generate the dark current. As semiconductor devices become ever more highly integrated, the trenches are further deepened and narrowed. In such case, it becomes more difficult to form the impurity region by ion implantation to surround the trench. As a result, the dark current may be increased.

Moreover, because ion implantation is performed under a relatively high energy condition, the impurity region is generally thickly formed. This is apt to shrink the depletion region of the photodiode formed adjacent to the trench, which may decrease the saturation current of the photodiode.

SUMMARY OF THE INVENTION

According to an exemplary embodiment of the present invention, a method of manufacturing a semiconductor device includes: forming a trench in a substrate to define a photodiode active region; doping an impurity into a bottom and a sidewall of the trench to form a channel stop impurity region, wherein the channel stop impurity region surrounds the bottom and the sidewall of the trench; forming a trench device isolating region by forming a gap-filling material layer into the impurity-doped trench; and forming a photodiode in the photodiode active region. The doping step may be performed by plasma doping.

The plasma doping may be performed using at least one of a dopant gas or a dilution gas.

The trench may be comprised of a deep trench configuration. The substrate may include a base substrate and an epitaxial layer formed on the base substrate, and the trench may be formed to penetrate through the epitaxial layer.

According to an exemplary embodiment of the present invention, a method of manufacturing an image sensor includes: forming a circuit trench within a peripheral circuit region to define a circuit active region, and forming a pixel trench within the pixel region to define a photodiode active region; doping an impurity into a bottom and a sidewall of the pixel trench to form a channel stop impurity region, wherein the channel stop impurity region surrounds the bottom and the sidewall of the pixel trench; forming a gap-filling material layer into the circuit trench to form a circuit trench device isolating region; forming a gap-filling material layer into the impurity-doped pixel trench to form a pixel trench device isolating region; and forming a photodiode within the photodiode active region.

The depth of the pixel trench may be deeper than depth of the circuit trench. The substrate may include a base substrate and an epitaxial layer formed on the base substrate, the circuit trench may be formed within the epitaxial layer, and the pixel trench may be formed to penetrate through the epitaxial layer.

According to an exemplary embodiment of the present invention, a semiconductor device includes: a trench device isolating region formed in a substrate to define a photodiode active region; a channel stop impurity region formed in the substrate contacting the device isolating region, wherein the channel stop impurity region surrounds a bottom and a sidewall of the device isolating region; and a photodiode formed within the photodiode active region.

An impurity density within the channel stop impurity region may be continuously decreased away from the device isolating region.

The thickness of the channel stop impurity region on the side of the device isolating region may have a ratio of 0.5 to 1 with respect to a thickness of the channel stop impurity region under the device isolating region.

According to an exemplary embodiment of the present invention, an image sensor includes: a substrate having a pixel region and a peripheral circuit region; a circuit trench device isolating region formed in the peripheral circuit region to define a circuit active region; a pixel trench device isolating region formed in the pixel region to define a photodiode active region; a channel stop impurity region formed in the substrate contacting the pixel trench device isolating region, wherein the channel stop impurity region surrounds a bottom and a sidewall of the pixel trench device isolating region; and a photodiode formed in the substrate of the photodiode active region.

The depth of the pixel trench device isolating region may be greater than the depth of the circuit trench device isolating region. The substrate may include a base substrate and an epitaxial layer formed on the base substrate, the pixel trench device isolating region may be formed within the epitaxial layer, and the pixel trench device isolating region may be formed to penetrate through the epitaxial layer.

The present invention will become readily apparent to those of ordinary skill in the art when descriptions of exemplary embodiments thereof are read with reference to the accompanying drawings.

BRIEF DESCRIPTION OF THE DRAWINGS

FIGS. 3A through 3F are sectional views illustrating a method of manufacturing the CMOS image sensor according to an exemplary embodiment of the present invention, taken along a line I-I of FIG. 2.

DESCRIPTION OF EXEMPLARY EMBODIMENTS

Figure 1:
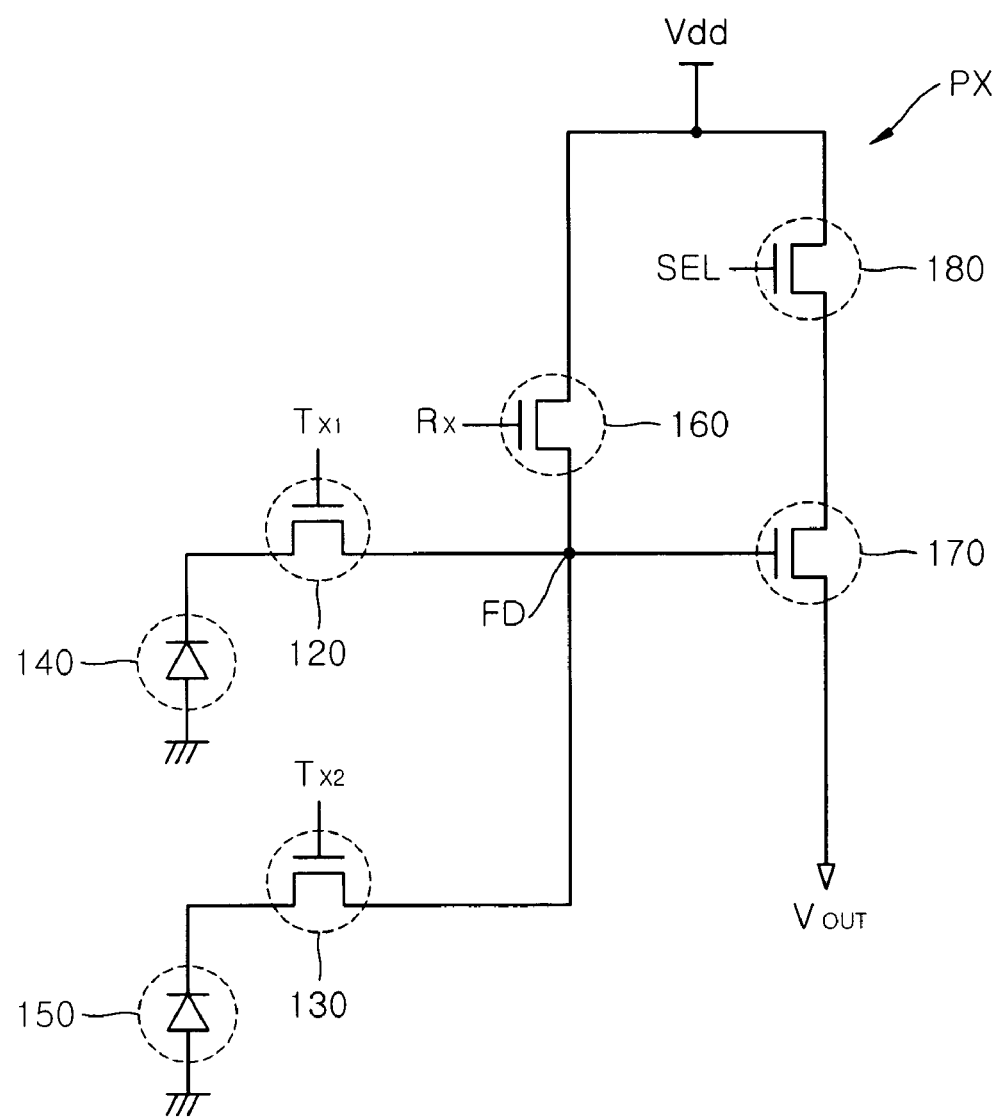
FIG. 1 is an equivalent circuit diagram of a unit pixel of a CMOS image sensor according to an exemplary embodiment of the present invention.

Hereinafter, exemplary embodiments of the present invention will be described in detail with reference to the accompanying drawings. It will be understood that when an element such as a layer, film, region, or substrate is referred to as being "on" another element, it can be directly on the other element, or intervening elements may also be present. Like reference numerals refer to similar or identical elements throughout the description of the figures.

FIG. 1 is an equivalent circuit diagram of a unit pixel of a CMOS image sensor according to an exemplary embodiment of the present invention.

Referring to FIG. 1, a unit pixel PX includes a first photodiode 140, a second photodiode 150, a first transfer transistor 120, a second transfer transistor 130, a reset transistor 160, a drive transistor 170, and a select transistor 180.

The first and second photodiodes 140 and 150 are respectively connected to sources of the first and second transfer transistors 120 and 130. Drains of the transfer transistors 120 and 130 commonly share a floating diffusion region FD that is a floating node. The reset transistor 160, the select transistor 180, and the drive transistor 170 are serially connected to the floating node FD. The floating node FD is also connected to a gate of the drive transistor 170. A power source Vdd is connected to a node between the reset transistor 160 and the select transistor 180.

Hereafter, driving a unit pixel PX, according to an exemplary embodiment of the present invention, will be described with reference to FIG. 1. First, when a reset signal $R_x$ is supplied to a gate of the reset transistor 160, the reset transistor 160 is turned on. The electrical potential of the floating node FD is reset to a power source voltage. Then, the reset transistor 160 is turned off. The incident light on the photodiodes 140 and 150 causes electron-hole pairs to be generated in proportion to the incident light. The generated signal charges are trapped to the photodiodes 140 and 150 by gate barriers of the transfer transistors 120 and 130.

When a transfer signal $T_{x1}$ is supplied to a gate of either one of the transfer transistors 120 or 130, it is turned on. For example, if the transfer signal $T_{x1}$ is supplied to the first transfer transistor 120, the first transfer transistor 120 is turned on. In such case, the signal charges trapped to the first photodiode 140 are transferred to the floating node FD to change the potential of the floating node FD. The gate bias of the drive transistor 170 is changed, and thus current drivability of the drive transistor 170 is determined. At this time, a select signal SEL is supplied to a gate of the select transistor 180, and the select transistor 180 is turned on. As the result, a current corresponding to the potential of the floating node FD flows through the drive transistor 170, which is supplied as an output voltage Vout. Here, $T_{x2}$ denotes a transfer signal supplied to a gate of the second transfer transistor 130.

As described above, the unit pixel includes at least two photodiodes, and the transistors are commonly shared to provide the signals from the photodiodes, and the unit pixel area is decreased, allowing for both higher integration and increased fill factor. It is to be understood that the unit pixel may have a single photodiode or at least three photodiodes, and arrangement and number of the transistors may be modified appropriately.

Figure 2:
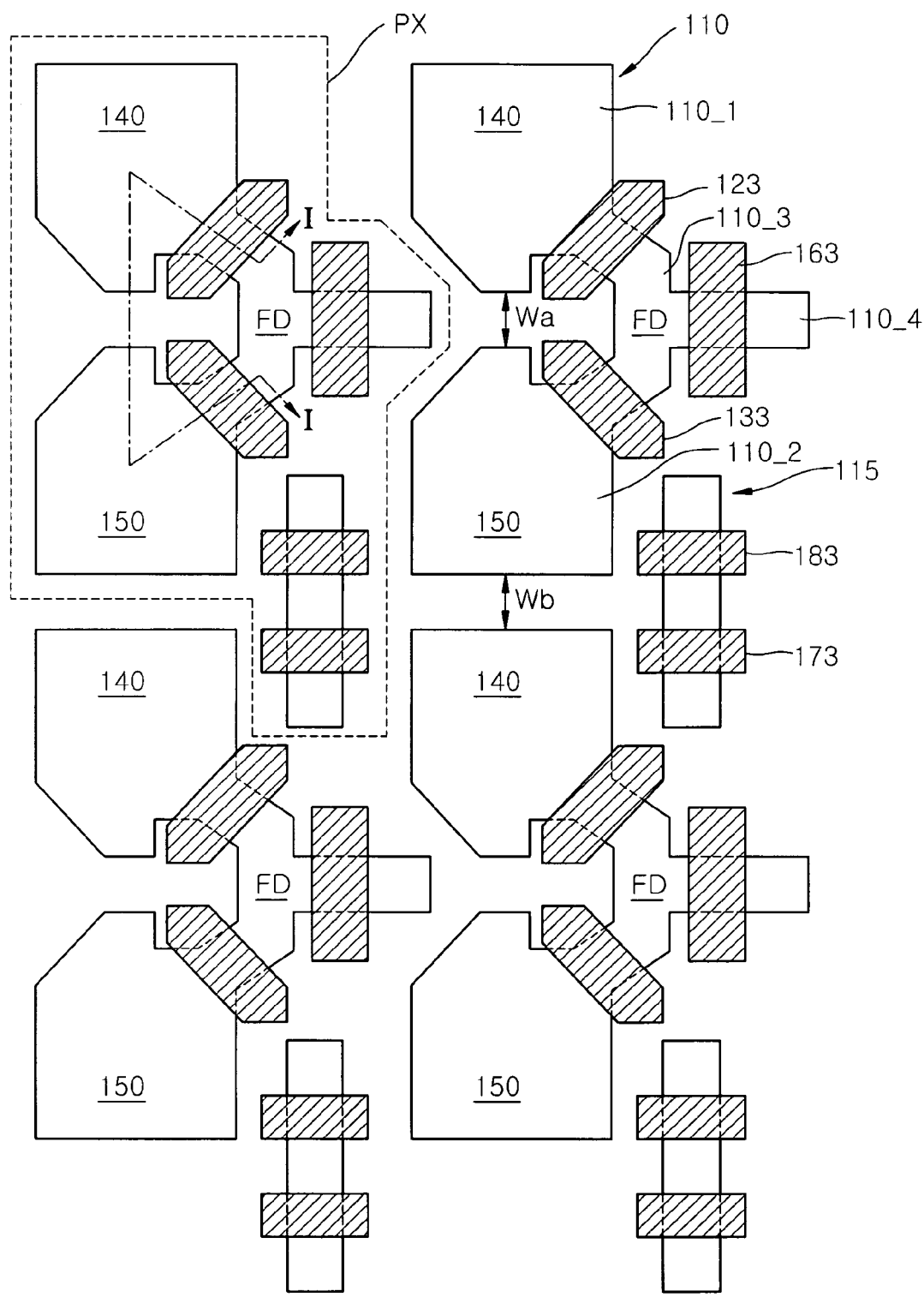
FIG. 2 is a plan view partially illustrating a pixel array unit, according to an exemplary embodiment of the present invention, for embodying the CMOS image sensor illustrated in FIG. 1.

FIG. 2 is a plan view partially illustrating of a pixel array unit, according to an exemplary embodiment of the present invention, for embodying the CMOS image sensor illustrated in FIG. 1.

Referring to FIG. 2, the pixel array unit includes unit pixels PX arranged in rows and columns. The unit pixel PX includes a first active region 110 and a second active region 115 defined by forming a trench device isolating region in a predetermined region of a substrate. The first active region 110 includes first and second photodiode active regions 110_1 and 110_2 spaced apart from each other, and a transfer transistor active region 110_3 extending from the first and second photodiode active regions 110_1 and 110_2 to connect the first and second photodiode active regions 110_1 and 110_2. A reset transistor active region 110_4 extends from the transfer transistor active region 110_3. First and second photodiodes 140 and 150 are formed into the first and second photodiode active regions 110_1 and 110_2.

A first transfer gate electrode 123, the second transfer gate electrode 133, a reset gate electrode 163, a select gate electrode 183, and a drive gate electrode 173 are arranged on the first and second active regions 110 and 115. The first and second transfer gate electrodes 123 and 133 traverse over the transfer transistor active region 110_3 in a manner of being respectively adjacent to the first and second photodiode active regions 110_1 and 110_2. A floating diffusion region FD is formed in the transfer transistor active region 110_3 exposed between the first and second transfer gate electrodes 123 and 133. The reset gate electrode 163 traverses over the reset transistor active region 110_4, and is adjacent to the floating diffusion region FD. Also, the select gate electrode 183 and the drive gate electrode 173 traverse over the second active region 115.

Interconnects (not shown) are disposed on the gate electrodes 123, 133, 163, 173 and 183. For example, an interconnect allows an active region opposite to the floating diffusion region FD out of the reset transistor active region 110_4 adjacent to the reset gate electrode 163 to be electrically connected to the second active region 115 exposed to one side of the select gate electrode 183, and is connected to the power source (Vdd of FIG. 1). Another interconnect allows the floating diffusion region FD to be electrically connected to the drive gate electrode 173.

On the other hand, intervals Wa and Wb between the photodiodes 140 and 150 may be reduced to decrease the area of the unit pixel PX and increase the fill factor. To prevent crosstalk from occurring between the photodiodes 140 and 150, the trench device isolating region between the first and second photodiode active regions 110_1 and 110_2 may be further deepened.

FIGS. 3A through 3F are sectional views illustrating a method of manufacturing the CMOS image sensor according to an exemplary embodiment of the present invention, which illustrate a pixel region and a peripheral circuit region taken along a line I-I of FIG. 2. The peripheral circuit region is placed in a periphery of the pixel array unit illustrated in FIG. 2, and a driving circuit to drive the pixel array unit is disposed therein.

Referring to FIG. 3A, a substrate 100' having a pixel region and a peripheral circuit region is prepared. The substrate 100' has a base substrate 100, and an epitaxial layer 101 having a first conductivity type and formed on the base substrate 100. The first conductivity type may be a P-type.

A pad insulating layer 103 and a hard mask layer 104 are sequentially stacked on the substrate 100'. The hard mask layer 104 is used as a hard mask, e.g., a silicon nitride layer, when forming a trench that will be described later. The pad insulating layer 103, e.g., a silicon oxide layer, relieves stress applied to the substrate 100' when stacking the hard mask layer 104.

A photoresist pattern (not shown) is formed on the hard mask 104. Using the photoresist pattern as a mask, the hard mask layer 104 and the pad insulating layer 103 is etched, thereby partially exposing the substrate 100'. Then, the photoresist pattern is removed.

The hard mask layer 104 is used as a mask to etch an exposed area of the substrate 100'. The trenches 100a and 100b are formed in the substrate 100'. In an exemplary embodiment of the present invention, the trenches 100a and 100b are formed in the epitaxial layer 101 and define the active regions. For example, the pixel trench 100a, formed in the substrate 100' of the pixel region, defines a pixel active region. The circuit trench 100b, defines a circuit active region formed in the substrate 100' of the peripheral circuit region. The pixel active region includes the first and second photodiode active regions (110_1 and 110_2 of FIG. 2) and the transfer transistor active region (110_3 of FIG. 2).

Referring to FIG. 3B, a buffer insulating layer 105 is stacked on the substrate 100' where the trenches 100a and 100b are formed. The buffer insulating layer 105 is formed on the hard mask layer 104 by filling up the trenches 100a and 100b. A photoresist pattern 109 is formed on the buffer insulating layer 105. The photoresist pattern 109 covers an entire surface of the peripheral circuit region, but, in the pixel region, is aligned to the hard mask layer 104 to expose the buffer insulating layer 105 on an upper surface of the pixel trench 100a.

Using the photoresist pattern 109 as a mask, the exposed buffer insulating layer 105 is etched. Therefore, the buffer insulating layer 105 within the pixel trench 100a is thoroughly etched, and a bottom of the pixel trench 100a is exposed. Then, the bottom of the exposed pixel trench 100a is etched to form a deep pixel trench 100a' as illustrated in FIG. 3C.

While the deep pixel trench 100a' is formed, the photoresist pattern 109 may be etched, and an upper surface of the buffer insulating layer 105 may be partially etched. The buffer insulating layer 105 acts as an etch buffer layer that does not expose the hard mask layer 104 while forming the deep pixel trench 100a' as described above.

Figure 3C:
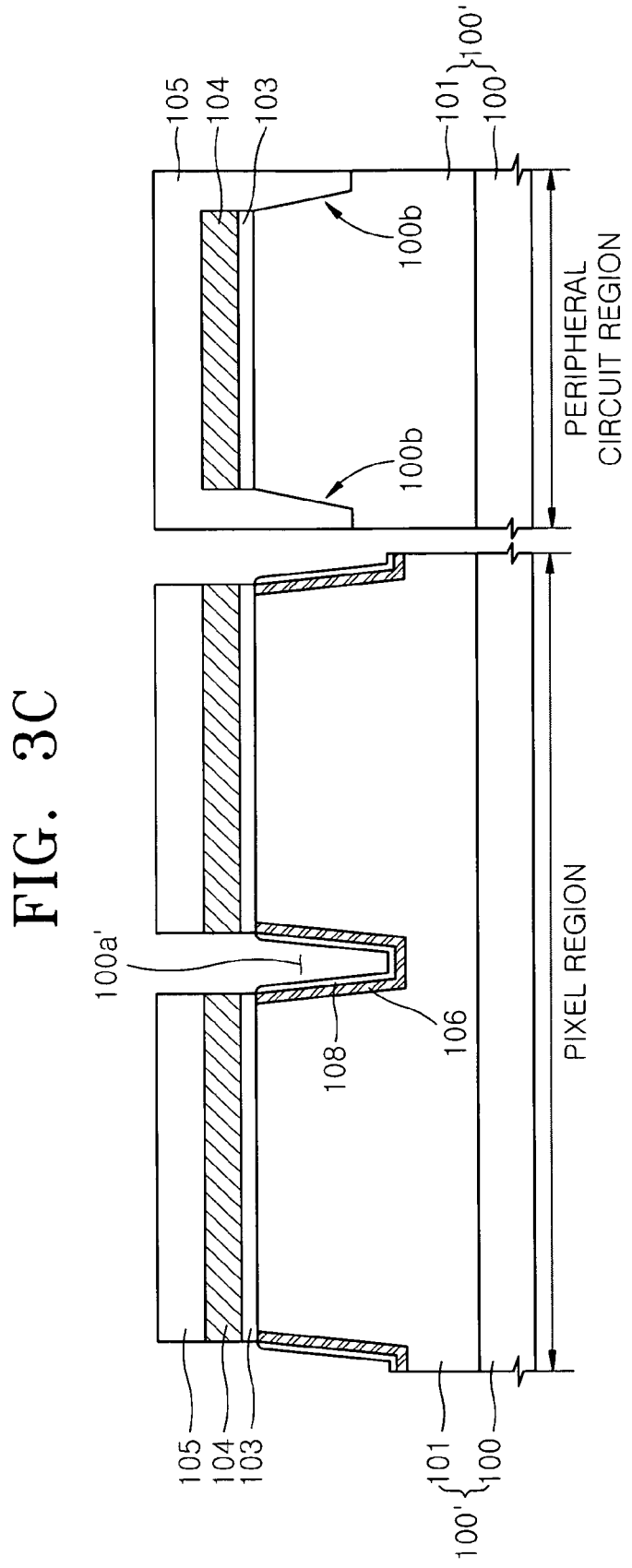

Referring to FIG. 3C, the depth of deep pixel trench 100a' is greater than that of the circuit trench 100b. The photodiode active regions (110_1 and 110_2 of FIG. 2) are sufficiently separated from each other to prevent the crosstalk apt to occurring between the photodiodes that will be formed in a subsequent process. According to an exemplary embodiment of the present invention, deep pixel trench 100a' has a depth of about 1 µm to about 4 µm, and may prevent crosstalk. The circuit trench 100b may be a shallow trench having a depth of about 0.4 µm or less. However, it is to be understood that the pixel trench may be formed as a shallow trench of 0.4 µm or less.

Both the deep pixel trench 100a' and the circuit trench 100b may be formed within the epitaxial layer 101. It is to be understood that the circuit trench 100b may be formed within the epitaxial layer 101 and the deep pixel trench 100a' may penetrate through the epitaxial layer 101.

Thereafter, an impurity is doped into the bottom and the sidewall of the pixel trench 100a' to form a channel stop impurity region 106 that surrounds the bottom and the sidewall of the pixel trench 100a'. When the channel stop impurity region 106 completely surrounds the bottom and the sidewall of the pixel trench 100a', the exposure of an interfacial surface of the pixel trench 100a' is prevented. In an exemplary embodiment of the present invention, the channel stop impurity region 106 conformally surrounds the bottom and the sidewall of the pixel trench 100a', and the dark current and noise caused by an interfacial surface defect of the pixel trench 100a' can be decreased.

The impurity doping may be a plasma doping process. For example, the substrate 100 having the pixel trench 100a' is placed within a plasma doping chamber (not shown), and dopant gas as a source gas is induced into the chamber. Then, the dopant gas is used to generate plasma, and a voltage is supplied to the substrate 100 to dope ions of the plasma into the substrate 100, e.g., the inside of the pixel trench 100a'. In an exemplary embodiment of the present invention, the plasma forms the channel stop impurity region 106 that surrounds the bottom and sidewall of the pixel trench 100a'. For example, when the pixel trench 100a' is formed as a deep trench configuration as described above, plasma doping may effectively form the channel stop impurity region 106 that surrounds the bottom and the sidewall of the deep trench. When plasma doping is used, the impurity is distributed by concentrating on a portion in contact with the pixel trench 100a', and a density of the impurity is continuously decreased away from the pixel trench 100a'. The channel stop impurity region 106 may be thinly formed and a depletion region of the photodiode that will be formed later is not reduced, and the decrease of the saturation current may be prevented.

The dopant gas may comprise, for example, $BF_3$, $B_2H_6$, $BCl_3$ or any combinations thereof. Boron may be doped into the channel stop impurity region 106. The source gas may include a dilution gas together with the dopant gas. The dilution gas may comprise, for example, $H_2$, $N_2$, $O_2$, $F_2$, He, Ar, Xe, or any combinations thereof. The dilution gas may be evenly dispersed in a density of plasma, distributing the channel stop impurity region 106 throughout the bottom and the sidewall of the pixel trench 100a'. In exemplary embodiments of the present invention, the channel stop impurity region 106 surrounds the bottom and the sidewall of the deep trench. For example, the thickness of the channel stop impurity region 106 on the side of the pixel trench 100a' may have a ratio of 0.5 to 1 with respect to the thickness of the channel stop impurity region 106 under the pixel trench 100a'.

Before doping the impurity, an oxide layer 108 may be formed within the pixel trench 100a'. The oxide layer 108 may block an inflow of a material besides boron when performing plasma doping. The oxide layer 108 may be a thermal oxide layer. When forming the thermal oxide layer, damages such as a lattice defect occurring within the trench 100a' may be relieved. For example, plasma doping may be performed with an energy in a range of about 1 kV to 7 kV, and may prevent the dark current and prevent the decrease of the saturation current.

In an exemplary embodiment of the present invention, plasma doping is performed with a dose in a range of about 0.1E13 atoms/cm$^2$ to about 1.0E18 atoms/cm$^2$.

Figure 3D:
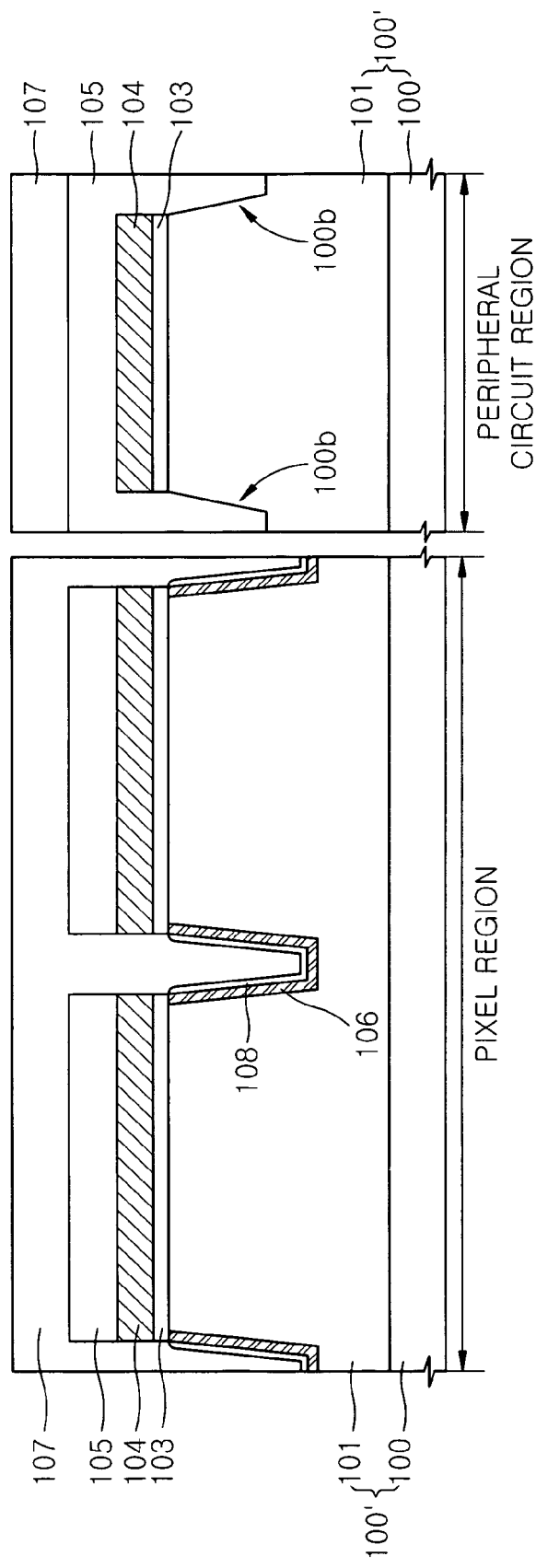

Referring to FIG. 3D, a gap-filling material layer 107 is formed within the impurity-doped pixel trench 100a'. The gap-filling material layer 107 may comprise an insulating layer. The gap-filling material layer 107 is formed on an upper surface of the buffer insulating layer 105. The gap-filling material layer 107 may comprise an insulating material, such as for example, a High Density Plasma-Chemical Vapor Deposition (HDP-CVD) oxide with an excellent gap-fill property or Undoped Silica Glass (USG). Chemical mechanical Polishing (CMP) is performed on the substrate 100' having the gap-filling material layer 107 thereon until the hard mask layer 104 is exposed, thereby planarizing the gap-filling material layer 107 and the buffer insulating layer 105. Thereafter, the hard mask layer 104 and the pad insulating layer 103 are removed to expose the active regions.

As illustrated in FIG. 3E, the pixel trench device isolating region 100a'', the gap-filling material layer 107, the circuit trench device isolating region 100b', and the buffer insulating layer 105 are formed.

An impurity having a second conductivity type is implanted within the substrate 100' of the peripheral circuit region, thereby forming a well 102 having the second conductivity type. For example, the second conductivity type may be an N-type. Thereafter, a gate insulating layer 119 is formed on the substrate 100', and a gate conductive layer is formed on the gate insulating layer 119. The gate conductive layer may be a doped polysilicon layer. The gate conductive layer is patterned to form a first transfer gate electrode 123 and a second transfer gate electrode 133 on the transfer transistor active region (110_3 of FIG. 2), and a circuit gate electrode 193 on the circuit active region. The gate insulating layer 119 may also be patterned. The first and second transfer gate electrodes 123 and 133 are formed adjacently to the first and second photodiode active regions (110_1 and 110_2 of FIG. 2), respectively.

A first photoresist pattern that exposes the transfer transistor active region 110_3 is formed. Then, using the first photoresist pattern and the first and second transfer gate electrodes 123 and 133 as masks, the impurity having the second conductivity type is implanted to form a floating diffusion region FD.

Thereafter, the first photoresist pattern is removed, and a second photoresist pattern for exposing the circuit active region is formed. Using the second photoresist pattern and the circuit gate electrode 193 as masks, the impurity having the first conductivity type is implanted to form source/drain regions 195.

A third photoresist pattern (not shown) to expose the photodiode active regions (110_1 and 110_2 of FIG. 2) is formed. Using the third photoresist pattern as a mask, the impurity having the second conductivity type is implanted into the first and second photodiode active regions (110_1 and 110_2 of FIG. 2) at a high energy, forming first and second lower impurity regions 147 and 157. Then, the third photoresist pattern is removed.

Referring to FIG. 3F, a spacer insulating layer is stacked on the substrate 100'. The spacer insulating layer is anisotropically etched to form spacers 129 along sidewalls of the gate electrodes 123, 133, and 193. A fourth photoresist pattern to expose the photodiode active regions (110_1 and 110_2 of FIG. 2) is formed on the substrate 100' where the spacers 129 are formed. Using the fourth photoresist pattern and the spacers 129 as masks, the impurity having the first conductivity type is implanted at a low energy to form first and second upper impurity regions 145 and 155. The first and second upper impurity regions 145 and 155 are formed within the first and second lower impurity regions 147 and 157, respectively. The first upper impurity region 145 and the first lower impurity region 147 comprise the first photodiode 140. The second upper impurity region 155 and the second lower impurity region 157 comprise the second photodiode 150.

The first and second upper impurity regions 145 and 155 may be formed using plasma doping. According to an exemplary embodiment of the present invention, the impurity density within the first and second upper impurity regions 145 and 155 are concentrated on the surface of the substrate 100', so that the first and second upper impurity regions 145 and 155 may be thinly formed, and the thickness of a depletion region is increased when the photodiodes 140 and 150 are operated, improving photosensitivity of the photodiodes 140 and 150.

Figure 4:
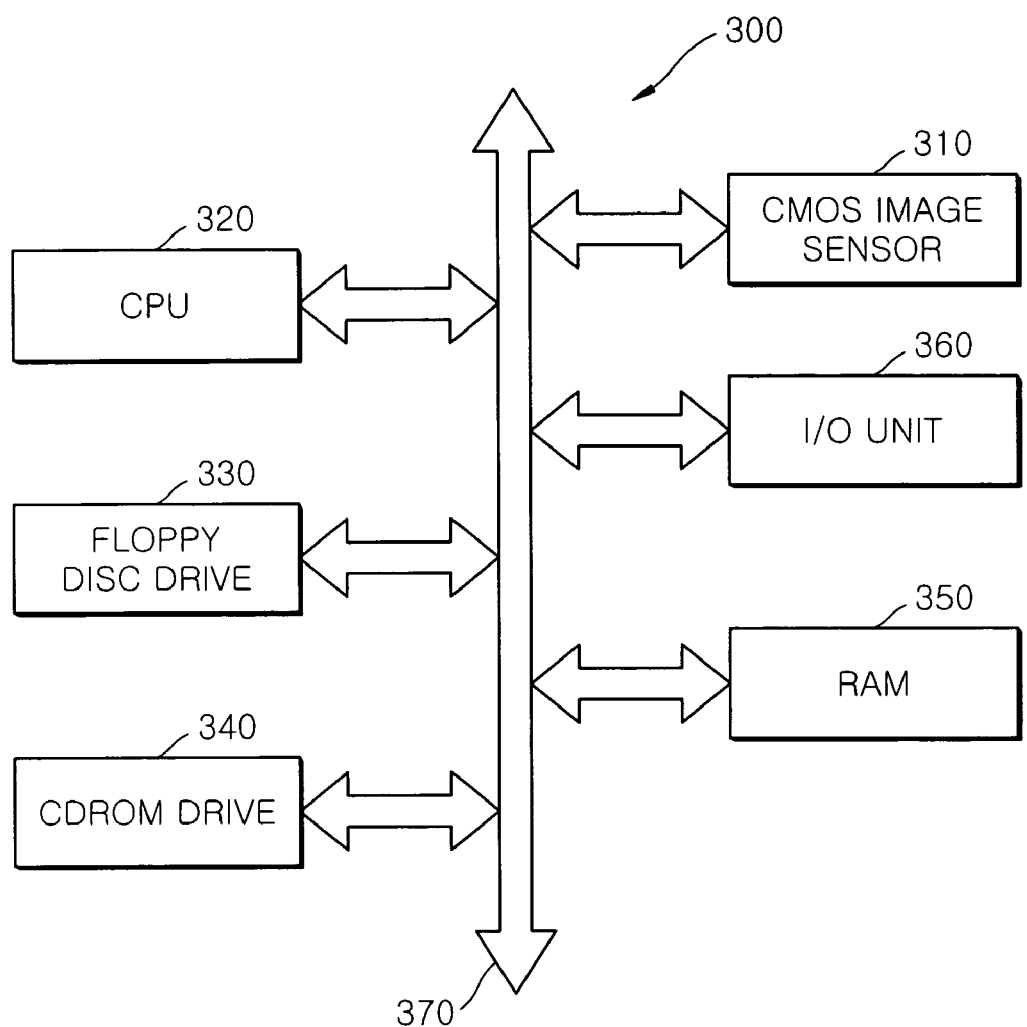
FIG. 4 is a diagrammatic view illustrating a computer processor system provided with the CMOS image sensor according to an exemplary embodiment of the present invention.

FIG. 4 is a diagrammatic view illustrating a computer processor system provided with the CMOS image sensor according to an exemplary embodiment of the present invention.

Referring to FIG. 4, a computer processor system 300 includes a Central Processor Unit (CPU) 320, a floppy disc drive 330, a CDROM drive 340, a CMOS image sensor 310, an I/O unit 360, and a RAM 350. The CMOS image sensor 310 may be embodied as described above with reference to FIGS. 1, 2, and 3A through 3F. The CPU 320, the CMOS image sensor 310, and the RAM 350 may be equipped within a System on Chip (SoC).

The CPU 320, the floppy disc drive 330, the CDROM drive 340, the CMOS image sensor 310, the I/O unit 360, and the RAM 350 may be mutually communicated via a bus 370.

Hereinafter, examples of experiments are presented to assist in understanding of exemplary embodiments of the present invention.

Dark Current and Random Noise Characteristics of CMOS Image Sensors

<Experiment 1>

An epitaxial layer is formed on a substrate, and a mask pattern comprising a silicon oxide layer and a silicon nitride layer is formed on the epitaxial layer. Using the mask pattern as a mask, the epitaxial layer is etched to a depth of about 0.3 μm to form a trench, defining a photodiode active region. Boron is doped into a bottom and a sidewall of the trench using plasma doping, forming a channel stop impurity region. When performing a plasma doping process, $BF_3$ is used as a source gas. The doping energy is 3 kV and the dose of $BF_3$ is 1.0E15atoms/cm$^2$. An HDP-CVD oxide layer is buried into the trench doped with boron, and the HDP-CVD oxide layer is planarized by CMP. Thereafter, the silicon nitride layer and the silicon oxide layer are removed to form a trench device isolating region. Phosphorus ions are implanted into the photodiode active region to form a lower impurity region, and boron is implanted to the photodiode active region to form an upper impurity region.

<Experiment 2>

A specimen is manufactured in the same manner as that of Experiment 1, except that BF$_3$ and N$_2$ are used as source gases when performing plasma doping, wherein the fluid quantity ratios of BF$_3$ and N$_2$ are 20% and 80%, respectively.

<Comparison 1>

When doping boron into the trench, plasma doping is not used. Instead, boron is implanted under process conditions of 30 kV and 1.2E13atoms/cm$^2$, and again implanted under process conditions of 10 kV and 6.0E12atoms/cm$^2$. All other process conditions and steps are the same as those of Experiment 1.

The measured dark current and random noise characteristics of the specimens according to Experiment 1, Experiment 2, and Comparison 1 are listed in Table 1.

TABLE 1

| | Boron Doping conditions within Trench | | Dark | |
| --- | --- | --- | --- | --- |
| | Plasma Doping | Ion Implantation | Current (mV/sec) | Noise (LSB) |
| Experiment 1 | BF$_3$, 3 kV, 1.0E15 atoms/cm$^2$ | — | 6 | 3.97 |
| Experiment 2 | BF$_3$, 3 kV, 1.0E15 atoms/cm$^2$ (20% BF$_3$, 80% N$_2$) | — | 7.5 | 3.65 |
| Comparison 1 | — | B, 30 kV, 1.2E13 atoms/cm$^2$ B, 10 kV 6.0E12 atoms/cm$^2$ | 14 | 4.65 |

Referring to Table 1, when boron is doped within the trench, the specimens according to Experiments 1 and 2 that use plasma doping have decreased dark current and lower noise than those of the specimen of Comparison 1. Experiment 2, in which N$_2$ is added as a dilution gas, exhibits a noise value less than that of Experiment 1. When an impurity is doped into the bottom and the sidewalls of the trench, the dark current characteristic and the random noise characteristic can be improved when using plasma doping.

When the inside of the trench is doped using plasma doping, a channel stop region completely surrounds the bottom and sidewall of the trench. Such a channel stop impurity region prevents charges which are generated from an interfacial surface of the trench involving a crystalline defect from reaching a photodiode, and the dark current and the noise may be decreased.

Doping Profile of the Bottom and Sidewall of the Trench

Figure 6:
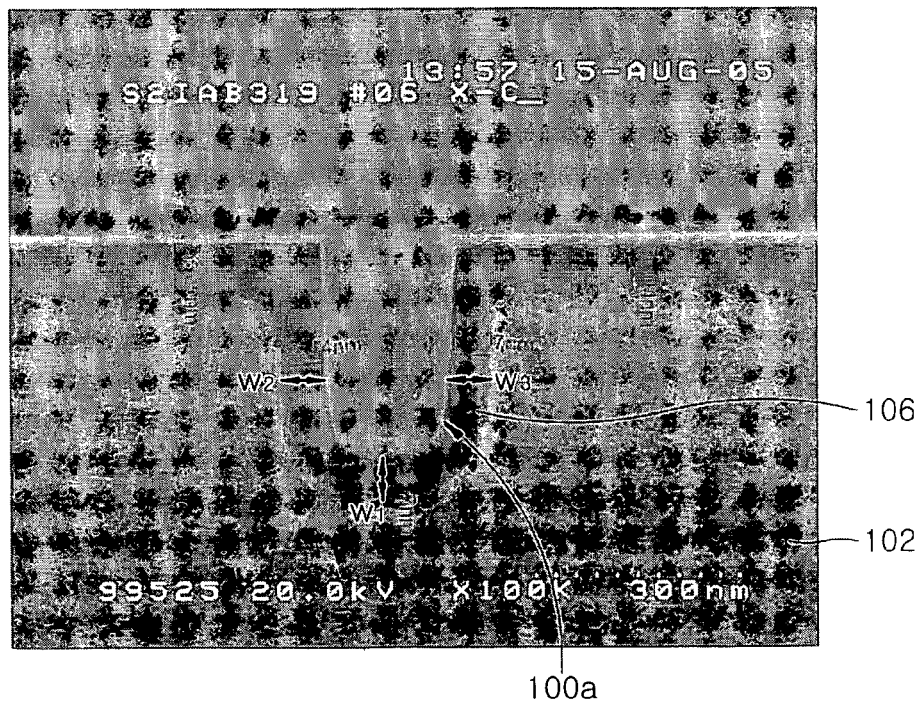
FIG. 6 is a photograph showing a trench device isolating region by Experiment 2.

FIG. 6 is a photograph taking the trench device isolating region by the Experiment 2.

Referring to FIG. 6, the thicknesses W$_2$ and W$_3$ of the channel stop impurity region 106 in both sides of the trench 100$a$ are 65.74 nm and 61.07 nm, respectively. The thickness W$_1$ of the channel stop impurity region 106 under the trench 100$a$ is 72.37 nm. Therefore, the thickness of the channel stop impurity region 106 in the side of the trench 100$a$ has a ratio of 0.86 or 0.91 with respect to the channel stop impurity region 106 under the trench 100$a$.

When BF$_3$ is solely used as the source gas without using the dilution gas (Experiment 1), the thickness of the channel stop impurity region on the side of the trench has a ratio of roughly 0.5 with respect to that under the trench.

When the channel stop impurity region is formed using plasma doping, the thickness of the channel stop impurity region on the side of the trench has a ratio of 0.5 to 1 with respect to that under the trench. When the channel stop impurity region is formed using plasma doping, the channel stop impurity region conformally encloses the sidewall of the trench. When the dilution gas is used during plasma doping, the conformality can be improved.

Doping Profile Within the Substrate

A substrate having an epitaxial layer is prepared, and boron is doped into the substrate using plasma doping, thereby forming an impurity region. When performing plasma doping, BF$_3$ and N$_2$ are used as source gases. Also, a fluid quantity ratio of BF$_3$ and N$_2$ are 20% and 80%, respectively. A doping energy is 3 kV and a dose of BF$_3$ is 1.0E15atoms/cm$^2$.

<Experiment 4>

A specimen is manufactured in the same manner as that of the Experiment 3, except that the doping energy during plasma doping is 1 kV.

<Comparison 2>

A substrate having an epitaxial layer is prepared. Boron is ion implanted under process conditions of 30 kV and 1.2E13atoms/cm$^2$, and again implanted under conditions of 10 kB and 6.0E12atoms/cm$^2$, thereby forming a boron-doped impurity region within the substrate.

The process conditions for doping boron into the specimens according to Experiment 3, Experiment 4, and Comparison 2 are listed in Table 2.

TABLE 2

| | Boron Doping Conditions within Trench | |
| --- | --- | --- |
| | Plasma Doping | Ion Implantation |
| Experiment 3 | BF$_3$, 3 kV, 1.0E15 atoms/cm$^2$ (20% BF$_3$, 80% N$_2$) | — |
| Experiment 4 | BF3, 1 kV, 1.0E15 atoms/cm$^2$ (20% BF$_3$, 80% N$_2$) | — |
| Comparison 2 | — | B, 30 kV, 1.2E13 atoms/cm$^2$ B, 10 kV, 6.0E12 atoms/cm$^2$ |

Figure 5:
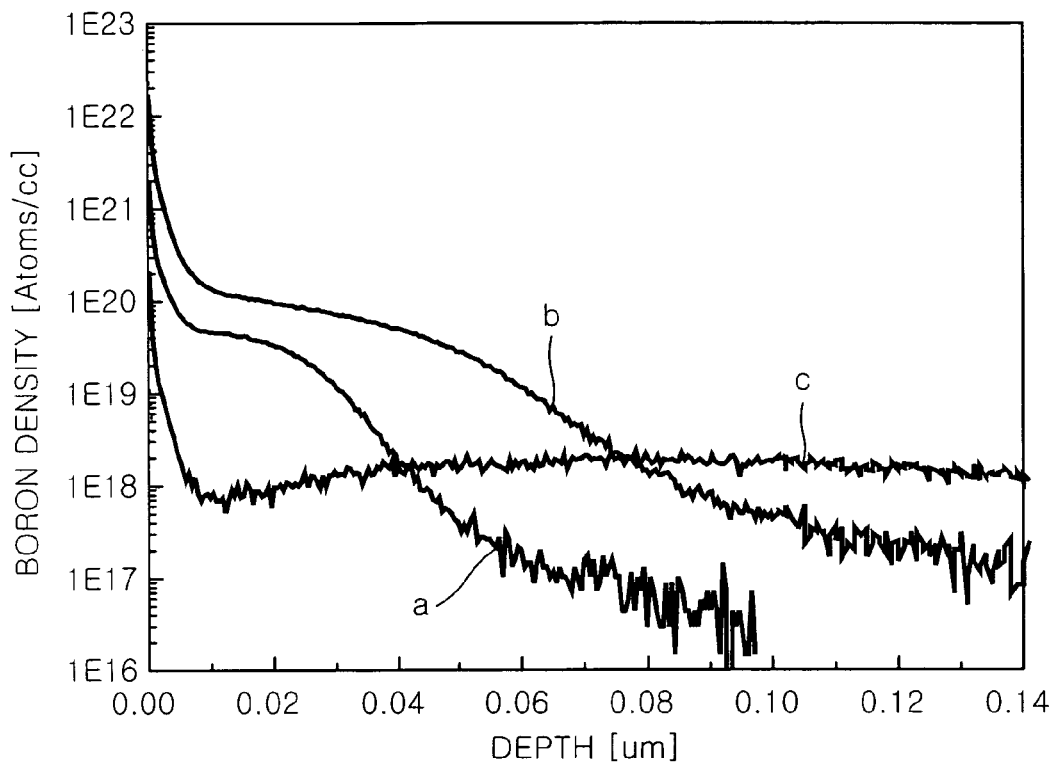
FIG. 5 is a graph showing a boron density in relation to the sidewall depth of the specimens resulting from Experiments 3 and 4 and Comparison 2.

FIG. 5 is a graph showing the boron density in relation to the sidewall depth of the specimens resulting from Experiments 3 and 4 and Comparison 2. In FIG. 5, a, b and c respectively denote the specimens of Experiments 3 and 4 and Comparison 2.

Referring to FIG. 5, the specimens a and b of Experiments 3 and 4 have a considerable quantity of the impurities on the surface of the substrate, and the density of the impurity is continuously decreased with depth from the surface of the substrate. The specimen c of Comparison 2 has an impurity density that decreased until reaching a depth of 0.01 μm from the surface of the substrate.

In view of these experiments, the impurity region formed using ion implantation is thicker than that formed using plasma doping. Although ion implantation performed by tilting an ion beam is used to form a channel stop impurity region into the side of the trench, the impurity region is thickly formed and decreases the depletion region of the photodiode that is adjacent to the side of the trench. In contrast, the channel stop impurity region formed by plasma doping does not affect the depletion region of the photodiode. Therefore, when the channel stop impurity region is formed using plasma doping, the decrease of the saturation current can be prevented.

According to an exemplary embodiment of the present invention an impurity is doped to a bottom and a sidewall of a trench to form a channel stop impurity region that completely surrounds the bottom and the sidewall of the trench, and dark current and noise may be decreased. In an exemplary embodiment of the present invention, the impurity doping is performed by plasma doping to thinly form the entire channel stop impurity region, preventing the decrease of the saturation current of a CMOS image sensor.

Although the exemplary embodiments of the present invention have been described in detail with reference to the accompanying drawings for the purpose of illustration, it is to be understood that the inventive processes and devices should not be construed as limited thereby. It will be readily apparent to those of reasonable skill in the art that various modifications to the foregoing exemplary embodiments can be made therein without departing from the scope of the invention as defined by the appended claims, with equivalents of the claims to be included therein.

What is claimed is:

1. A method of manufacturing an image sensor comprising:
    forming a circuit trench within a peripheral circuit region of a substrate to define a circuit active region, and forming a pixel trench within the pixel region of the substrate to define a photodiode active region using a hard mask layer as a mask;
    forming a buffer insulating layer on the hard mask layer to fill the circuit trench and the pixel trench;
    patterning the buffer insulating layer to expose a bottom of the pixel trench and to cover the hard mask layer;
    etching the exposed bottom of the pixel trench to form a deer pixel trench using the buffer insulating layer as an etching buffer layer covering the hard mask layer, a depth of the deep pixel trench being greater than a depth of the circuit trench;
    doping an impurity into a bottom and a sidewall of the deep pixel trench to form a channel stop impurity region, wherein the channel stop impurity region surrounds the bottom and the sidewall of the deep pixel trench;
    forming a gap-filling material layer into the circuit trench to form a circuit trench device isolating region;
    forming a gap-filling material layer into the impurity-doped pixel trench to form a pixel trench device isolating region; and
    forming a photodiode within the photodiode active region.

2. The method of claim 1, wherein the depth of the pixel trench is about 1 μm to about 4 μm.

3. The method of claim 1, wherein the doping step is performed using plasma doping.

4. The method of claim 3, further comprising forming an oxide layer within the deep pixel trench before the doping step.

5. The method of claim 3, wherein the plasma doping is performed using at least one of a dopant gas or a dilution gas.

6. The method of claim 1, wherein the substrate comprises a base substrate and an epitaxial layer formed on the base substrate, wherein the circuit trench and the deep pixel trench are formed within the epitaxial layer.

7. The method of claim 1, wherein forming the photodiode comprises:
    forming a lower impurity region within the photodiode active region; and
    forming an upper impurity region on the lower impurity region using plasma doping.

* * * * *